(12) United States Patent
Ishikawa et al.

(10) Patent No.: US 7,800,301 B2
(45) Date of Patent: Sep. 21, 2010

(54) ORGANIC ELECTROLUMINESCENT DEVICE COMPRISING A PRISM STRUCTURE

(75) Inventors: Shun-ichi Ishikawa, Kanagawa (JP); Yoshitaka Kitamura, Kanagawa (JP); Sanpei Iida, Kanagawa (JP); Takayuki Fujiwara, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 730 days.

(21) Appl. No.: 11/217,343

(22) Filed: Sep. 2, 2005

(65) Prior Publication Data

US 2006/0049749 A1 Mar. 9, 2006

(30) Foreign Application Priority Data

Sep. 6, 2004 (JP) ............................ 2004-259034

(51) Int. Cl.
*H01L 51/50* (2006.01)
*H01L 51/52* (2006.01)
*G02B 5/02* (2006.01)
*G02B 13/20* (2006.01)
*F21V 7/04* (2006.01)

(52) U.S. Cl. ..................... 313/509; 313/504; 313/506; 359/599; 362/620; 362/624

(58) Field of Classification Search ......... 313/498–512; 362/339, 337, 97, 608, 558, 620, 626, 330; 359/599
See application file for complete search history.

(56) References Cited

U.S. PATENT DOCUMENTS

| | | | | |
|---|---|---|---|---|
| 5,771,328 A | * | 6/1998 | Wortman et al. | 385/146 |
| 5,919,551 A | * | 7/1999 | Cobb et al. | 428/156 |
| 6,157,486 A | * | 12/2000 | Benson et al. | 359/498 |
| 6,441,551 B1 | * | 8/2002 | Abe et al. | 313/503 |
| 6,478,438 B1 | * | 11/2002 | Ishikawa et al. | 362/620 |
| 6,787,976 B2 | * | 9/2004 | Minoura et al. | 313/110 |
| 6,864,491 B2 | * | 3/2005 | Honda et al. | 250/484.4 |
| 6,883,950 B2 | * | 4/2005 | Adachi et al. | 362/555 |

(Continued)

FOREIGN PATENT DOCUMENTS

JP 06082635 A * 3/1994

(Continued)

OTHER PUBLICATIONS

Kitamura et al., "Light Out-Coupling Efficiency of Organic Electroluminescent Devices with Random Dots for Emission Site," *Japan Society of Applied Physics & Related Society*, 51st Meeting 2004, 30a-ZN-13.

(Continued)

*Primary Examiner*—Sikha Roy
*Assistant Examiner*—Jose M Diaz
(74) *Attorney, Agent, or Firm*—Birch, Stewart, Kolasch & Birch, LLP

(57) ABSTRACT

Disclosed is an organic electroluminescent device comprising a first electrode, a second electrode, at least one organic layer containing a luminescent layer and disposed between the first electrode and the second electrode, a transparent substrate and a prism structure disposed between the first electrode or the second electrode and the transparent substrate, wherein the prism structure is disposed such that the apexes of the prisms face the transparent substrate side and the coefficient of variation in the pitch of the apexes of the prisms is 1% or more.

16 Claims, 3 Drawing Sheets

U.S. PATENT DOCUMENTS

| | | | |
|---|---|---|---|
| 7,009,340 B2 * | 3/2006 | Asai et al. | 313/512 |
| 7,126,270 B2 * | 10/2006 | Fujii | 313/505 |
| 7,367,705 B2 * | 5/2008 | McCollum et al. | 362/627 |
| 7,384,173 B2 * | 6/2008 | Whitney | 362/330 |
| 7,427,438 B2 * | 9/2008 | Jones et al. | 428/331 |
| 7,643,218 B2 * | 1/2010 | Wilson et al. | 359/669 |
| 2002/0180348 A1 | 12/2002 | Oda et al. | |
| 2004/0080938 A1 * | 4/2004 | Holman et al. | 362/231 |
| 2004/0150329 A1 * | 8/2004 | Asai et al. | 313/506 |
| 2004/0263039 A1 * | 12/2004 | Takei et al. | 313/110 |
| 2005/0007000 A1 * | 1/2005 | Chou et al. | 313/116 |
| 2005/0018307 A1 * | 1/2005 | Kamijima | 359/628 |
| 2005/0059766 A1 * | 3/2005 | Jones et al. | 524/431 |
| 2006/0043362 A1 * | 3/2006 | Ishikawa et al. | 257/40 |

FOREIGN PATENT DOCUMENTS

| | | |
|---|---|---|
| JP | 2991183 | 10/1999 |
| JP | 2000186094 A | 7/2000 |
| JP | 2001172284 A | 6/2001 |
| JP | 2002305083 A | 10/2002 |
| JP | 2003086353 A | 3/2003 |
| JP | 2003323987 A | 11/2003 |
| JP | 2004103577 A | 4/2004 |
| JP | 2004146067 A | 5/2004 |
| JP | 2004214178 A | 7/2004 |
| JP | 2004221068 A | 8/2004 |

OTHER PUBLICATIONS

Gu et al., "High-external-quantum-efficiency Organic Light-emitting Devices," *Optics Letters*, 1997, vol. 22, No. 6, pp. 396-398.

* cited by examiner

ORGANIC ELECTROLUMINESCENT DEVICE COMPRISING A PRISM STRUCTURE

CROSS-REFERENCE TO RELATED APPLICATION

This application claims priority under 35 USC 119 from Japanese Patent Application No. 2004-259034, the disclosure of which is incorporated by reference herein.

BACKGROUND OF THE INVENTION

1. Field of the Invention

The present invention relates to an organic electroluminescent device, which can emit light by converting electric energy to light (hereinafter, also referred to as "organic EL device", "luminescent device" or "EL device").

2. Description of the Related Art

Organic EL devices have been attracting attention as promising display devices because highly luminescent emission is obtained from these devices at a low voltage. However, these organic EL devices generally have lower luminous efficiency than, for instance, inorganic LED devices. Accordingly, organic EL devices more improved in luminous efficiency and luminance have been needed.

The external energy efficiency indicating the luminous efficiency of an organic EL device is given by the product of the internal energy efficiency and the light-extraction efficiency of the device (see, for example, "Optics Letters" (1997), vol. 22, No. 6, page 396, the disclosure of which is incorporated by reference herein.). In order to improve the luminous efficiency of an organic EL device, it is necessary to improve the light-extraction efficiency as well as the internal energy efficiency.

The light-extraction efficiency means the ratio of luminescence emitted to the air from the front side of a transparent substrate of a device to the luminescence of the device. Before the luminescence in a luminescent layer is emitted to the air, it must pass through the boundaries of several media differing in refractive index. According to Snell's refraction law, light incident to each boundary at an angle larger than the critical angle of the boundary is wholly reflected on the boundary, propagates in a layer and then disappears or is emitted from the side surface of the layer, so that the amount of light emitted from the front of the device is reduced by that amount. As a consequence, the front luminance is reduced when the device is applied to, for example, a display.

As a method of improving the reduction in front luminance, a method is known in which a diffraction grating made of dots and grooves is formed at the boundary to allow light to diffract, thereby extracting light (see, for example, Japanese Patent No. 2991183, the disclosure of which is incorporated by reference herein.). In this case, the degree of improvement in the front luminance is insufficient and also, a rainbow color appears due to the interference of reflected light, and this method is therefore undesirable.

An attempt to eliminate this rainbow color by random dots has been recently reported (see, for example, "Preprints, (The 51st Meeting 2004), Japan Society of Applied Physics & Related Society, 30a-ZN-13, the disclosure of which is incorporated by reference herein.). This trial succeeded in eliminating light interference. However, the degree of improvement in the front luminance is decreased and remains unsatisfactory.

As a method of improving the reduction in front luminance, a method in which a prism is disposed at the boundary is known (see, for example, Japanese Patent Application Laid-Open (JP-A) No. 2003-86353, the disclosure of which is incorporated by reference herein.). This method greatly improves the front luminance because the prism has a light converging function.

Although there is the problem that an image formed through a prism is blurred, leading to reduced contrast, this can be improved by decreasing the distance between the luminescent layer and the prism and by decreasing the distance (pitch) between the apexes of the prisms.

However, if these prisms are formed regularly and the pitch of these prisms is decreased, the same problem as in the case of the aforementioned diffraction grating, specifically, the aforementioned rainbow color problem caused by the interference of reflected light arises. In this situation, no method that can solve this rainbow color problem has been found that does not also decrease the degree of improvement in luminance.

SUMMARY OF THE INVENTION

The present invention addresses the above-noted problems by disposing the prism structure interposed between the electrode and the transparent substrate such that the apexes of the prism structure face the transparent substrate side and the prism is arranged in a randomized manner.

Specifically, the invention is attained by the following means.

<1> An organic electroluminescent device comprising a first electrode, a second electrode, at least one organic layer containing a luminescent layer and disposed between the first electrode and the second electrode, a transparent substrate disposed on the side from which light is extracted and a prism structure disposed between the first electrode or the second electrode and the transparent substrate, wherein the prism structure is disposed such that the apexes of the prisms face the transparent substrate side and the coefficient of variation in the pitch of the apexes of the prisms is 1% or more.

<2> An organic electroluminescent device according to the above <1>, wherein the coefficient of variation in the pitch of the apexes of the prisms is 3% or more.

<3> An organic electroluminescent device according to the above <1> or <2>, wherein the first electrode is a positive electrode and the second electrode is a negative electrode and the prism structure is disposed on the first positive electrode side.

<4> An organic electroluminescent device according to the above <1> or <2>, wherein the first electrode is a positive electrode and the second electrode is a negative electrode and the prism structure is disposed on the second negative electrode side.

<5> An organic electroluminescent device according to any one of the above <1> to <4>, wherein the average of the pitch of the apexes of the prisms is 0.4 μm or more and 20 μm or less.

<6> An organic electroluminescent device according to any one of the above <1> to <5>, wherein the apexes of the prisms have the same height and are stuck to the transparent substrate.

DETAILED DESCRIPTION OF THE INVENTION

Figure 1:
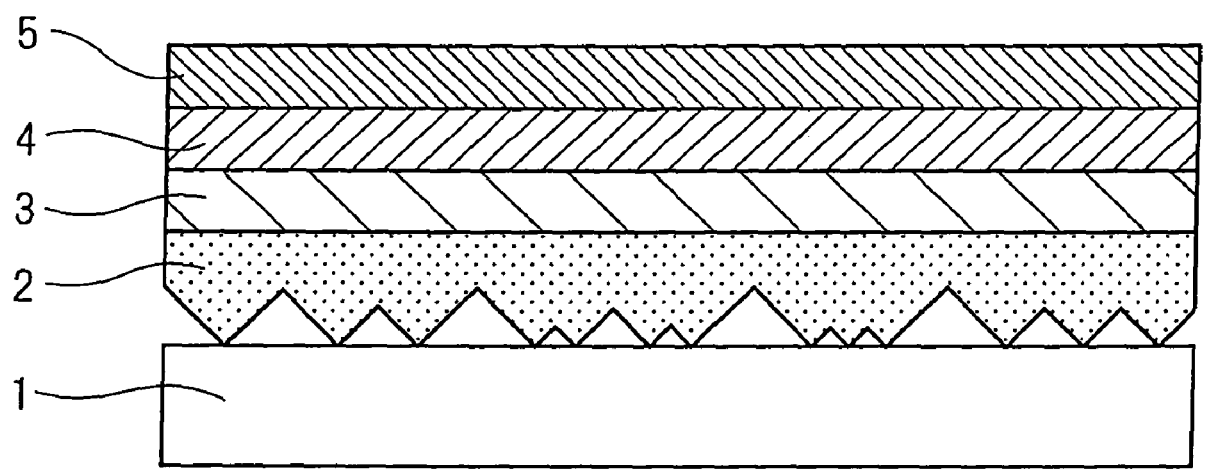
FIG. 1 is a view showing a layer structure of a bottom emission system that is one embodiment of an organic electroluminescent device according to the invention.

The present invention can provide an organic electroluminescent device, which enables a high luminance and high contrast image to be displayed and prevents the occurrence of a rainbow color caused by the diffraction of reflected light.

In an embodiment, the organic electroluminescent device of the invention comprises a first electrode, a second electrode, at least one organic layer containing a luminescent layer and disposed between the first electrode and the second electrode, a transparent substrate and a prism structure disposed between the first electrode or second electrode and the transparent substrate, wherein the prism structure is disposed such that the apexes of the prisms face the transparent substrate side and the coefficient of variation in the pitch of the apexes of the prisms is 1% or more.

<Prism Structure>

The prism structure in the invention means a structure having plural prisms and is, for example, a structural one in which V-shape grooves are formed with a certain pitch on the surface of a metal oxide layer.

The foregoing prism usually means a transparent body having two or more optical planes, wherein at least one pair of planes is not parallel even in terms of approximation.

Prisms are applied to optical parts because they have a light converging effect. For example, an optical material obtained by forming many regular V-shape grooves with a pitch of tens to hundreds μm is known as a prism sheet. Those having a waveform plane and those having a prism with a round apex are regarded as prism sheets. The invention embraces such forms.

The studies made by the inventors have clarified that if the pitch (distance between apexes) of the prisms is decreased to as small as about 20 μm, the prism works as a reflection type diffraction grating, which diffracts the reflected light of external light and a significant rainbow color is seen when the external light is diffracted at a certain angle or more, which gives rise to problems particularly in the case of intending to use an EL device having the prism as a display.

Here, the inventors of the invention have found that if prisms are formed in such a randomized manner that the coefficient of variation in the pitch of the prism is 1% or more, this rainbow color problem can be reduced while the degree of an improvement in luminance is the same as in the case of forming prisms in a non-randomized manner.

The foregoing coefficient of variation is preferably 1 to 350% and more preferably 3 to 250% from the viewpoint of preventing a reduction in contrast, improving luminance and reducing a rainbow color. Though a larger coefficient of variation brings about a larger effect of reducing a rainbow color, the above range is preferable from the viewpoint of manufacturing the prisms easily The coefficient of variation here means the ratio of the standard deviation of the pitch to the average of the pitch.

The aforementioned randomization means that the prisms of the prism structure are arranged in the prism structure such that pitches (distances between apexes) are randomized and the degree of randomization is defined as follows.

In the invention, the degree of randomization is defined using the coefficient of variation (=standard deviation÷average). The standard deviation σ is represented by the following equation:

$$\sigma = \sqrt{\frac{\sum_{i=1}^{n}(x_i - \mu)^2}{n}}$$

where $x_i$ represents a prism pitch, $\mu$ represents an average of the prism pitches and n denotes the total number—1 of the peaks of the prism.

Therefore, the coefficient q of variation is given by the following equation:

$$q = \frac{1}{\mu}\sqrt{\frac{\sum_{i=1}^{n}(x_i - \mu)^2}{n}} \times 100(\%)$$

where $x_i$ represents a prism pitch, $\mu$ represents an average of the prism pitches and n denotes the total number—1 of the peaks of the prism.

As examples of a method of determining a random prism pitch, the case where the pitch has a uniform distribution and the case where the pitch has a normal distribution will be described herein below; however, the invention is not limited to these cases.

1. Uniform distribution (the frequency of occurrence of a pitch is uniform between the minimum value and maximum value of the pitch.)

A specific value of a random pitch is found using the RAND function of Excel 2000 of Microsoft. This RAND function outputs a random number in a range from 0 to 1. The obtained number is named $R_i$ to calculate $x_i$ from the following equation and the obtained $x_i$ is adopted as the value of the pitch:

$$x_i = R_i \times (P_{max} - P_{min}) + P_{min}$$

where $P_{min}$ is the minimum value of the pitch and $P_{max}$ is the maximum value of the pitch.

2. Normal distribution (the frequency of occurrence of a pitch has a normal distribution on the center of the average pitch $\mu$.)

Like the above 1 (uniform distribution), a random number falling in a range from 0 to 0 is output as $R_i$. Using the NORMINV function of Excel 2000, pitch Yi is found from the following equation: Yi=NORMINV (Ri, $\mu$, $\sigma$), where $\mu$ is an average pitch and $\sigma$ is a standard deviation to be intended.

These procedures are repeated to obtain (the number of peaks—1) Yi. In the case of intending to set the upper limit and lower limit of the distribution of pitch, Yi out of the range may be neglected.

In the invention, the prism structure is disposed between the transparent substrate on the side from which light is extracted and the electrode (the first or second electrode) on the side from which light is extracted, wherein the apexes of the prisms are facing the transparent substrate side. In this case, it is preferable that the apexes (peaks) of the prisms have the same height and be adhered to the transparent substrate from the viewpoint of mechanical strength.

Specifically, the prism structure preferably has the structure in which the prisms are formed in such a randomized manner that the coefficient of variation in the pitch of the prisms is 1% or more and the levels of the apexes of the prisms accord to each other.

The average pitch of the prisms is preferably 0.4 μm or more and 20 μm or less, more preferably 1 μm or more and 15 μm or less and particularly preferably 2 μm or more and 10 μm or less from the viewpoint of preventing a reduction in contrast and improving luminance. When the average pitch of the prisms is less than 0.4 μm, which is a wavelength of visible light, light converging effect is not obtained sufficiently.

The most preferable embodiment is a preferable combination among the aforementioned methods.

The following explanation describes the production of the prism structure.

The aforementioned random-pitch prisms may be formed directly from raw material by cutting and processing using the method described below. However, it is usually preferable to first manufacture a mold using Ni or the like.

First, an example of programming when forming a row of V grooves having an apex angle of θ at a pitch varied in a range from $P_{min}$ to $P_{max}$ randomly is shown.

The processing of the aforementioned row of V grooves having an apex angle of θ is preferably carried out by hail processing using a diamond bite. The way of thinking as to this processing may be applied to other processing methods (fly cut).

The pitch $P_{min}$ is preferably 0.1 to 10 μm and more preferably 0.1 to 1 μm from the viewpoint of the accuracy of the machinery processing though depending on the accuracy of a processing machine and the quality of material to be processed.

The above $P_{max}$ is preferably larger than $P_{min}$, and is preferably designed to be a maximum value at which desired resolution is obtained.

Also, it is necessary to be able to form random pitch grooves within the range of the resolution of a processing machine.

The aforementioned $P_{max}$ μm and $P_{min}$ μm are preferably designed so as to satisfy the following relationship to avoid excessively narrow pitch: $1.05 \times P_{min} \leq P_{max} \leq 5 \times P_{min}$.

A method of dispersing the pitch to a desired pitch width P(n) by using a random number R(n) will be explained.

First, as mentioned above, a random number R(n) is output using a calculating table software. Here, R(n) is given as a number from 0 to 1. The use of the following equation (1) makes it possible to disperse R(n) to a desired pitch width P(n).

$$P(n) = R(n) \times (P_{max} - P_{min}) + P_{min} \quad (1)$$

where n is a value defined in accordance with a necessary area.

In the case of processing an area 300 mm in length in the direction of pitch in the following condition: $P_{max}=5$ μm and $P_{min}=1$ μm, as the average pitch is 3 μm, it is necessary to form about $300/0.003=10^5$ V-grooves.

The absolute coordinate Pab(n) of the V groove is determined based on P(n).

$$Pab(n) = \Sigma P(n) \quad (2)$$

Next, the depth d of cut is determined by the following equation (3).

$$d = (\tfrac{1}{2}) \cdot P(n)/\tan(\theta/2) \quad (3)$$

In the case of easily cuttable materials, V-groove processing can be carried out based on the cutting depth given by the equation (3). However, in the case of non-electrolytic nickel used frequently in fine molds, it is preferable to divide the cutting depth into several depths of cut to manufacture the groove little by little from the viewpoint of preventing the sagging of edges. In this case, it is preferable to decrease the amount of the cutting depth d (m) according to the increase in depth. Moreover, in order to obtain a good processed surface, spark-out (the amount of cutting depth=0) is carried out finally. This enables a good shape to be created.

The above method is applied to the case where the pitches are distributed uniformly in the range from $P_{min}$ to $P_{max}$.

In the invention, it is not required that the pitches be distributed uniformly. In the case where the distribution of the pitches is, for example, a normal distribution, a method of manufacturing a desired random pitch is as mentioned above.

The aforementioned processing speed (running speed of a diamond bite) is preferably higher from the viewpoint of the quality in processing the surface and processing efficiency. However, in the hail processing method in which tools are moved reciprocally, there is a limit to a high-speed operation and the processing speed is therefore preferably about 1,000 to 5,000 mm/min.

If the processing is carried out using the above method, the levels of the apexes (peaks) of the mold accord to each other. Making d(m) a constant value enables the formation of a pattern by which the levels of the bottoms accord to each other.

After the random pitch V-groove array is completed, the moving direction of the tool or the direction of the material to be processed is turned at an angle of 90° to carry out the processing of a random pitch V-groove, whereby a random pitch tetragonal pyramid array (pyramid type array) can be created. In the invention, such a pyramid type array is also preferably used.

-Production of a Prism Structure-

A prism structure may be formed using the above mold by transferring.

Specifically, a medium put into a solution state is poured into the foregoing mold and cured by the effect of light or heat or by simple cooling. Then, the product is released from the mold, and thus the prism pattern is transferred. If the medium put into a solution state is made to contain materials forming the prism structure, the prism structure can be manufactured.

The medium, which is put into a solution state and is to be poured into the mold, may be either one which finally forms the prism structure or an intermediate transfer medium such as a silicone elastomer. Namely, the transferring may be repeated according to the need.

The following explanations discuss the case of manufacturing the prism structure by transferring.

When the pattern is transferred even times from a mold with peaks having the same levels, a prism structure with peaks having the same levels can be formed whereas when the pattern is transferred odd times from a mold with bottoms having the same levels, a prism structure with peaks having the same levels can be formed. Generally, it is preferable that a prism structure with peaks having the same levels can be formed finally. As to which mold is to be use, it is possible to change the type of mold in consideration with easiness of the manufacturing process.

In the case of a pyramid, a female type with concaved apexes is formed by the transfer operation repeated odd times. It is therefore necessary to obtain a pyramid structure (prism structure) with peaks having the same levels either by carrying out the transfer operation even times from a mold with peaks having the same levels or by carrying out the transfer operation odd times from a female type mold produced from that male mold by the transfer operation.

As the apex angle of a prism is more acute, a larger improvement in luminance is obtained: however, a reduction in contrast is increased. If the apex angle is more obtuse, a reduction in contrast is limited but the degree of an improvement in luminance is decreased. Therefore, the apex angle is preferably 60° to 120°, more preferably 70° to 110° and still more preferably 80° to 100°.

Examples of the material constituting the prism structure may include organic polymer materials such as an acryl resin, epoxy resins, polyimide resins and polycarbonate resins and inorganic materials such as metal oxides. When organic polymer materials are used, the prism structure can easily be manufactured due to a capability of application of a method of heat-pressing in a mould. When metal oxides are used, the prism structure having a large refractive index can be manufactured.

When the organic EL device of the invention is formed, a prism structure like the above is formed such that the distance from the prism side surface of the luminescent layer to the bottom surface of the prism (the surface including the deepest V-groove) is preferably 100 μm or less and more preferably 50 μm or less from the viewpoint of contrast and is disposed such that the apexes of the prism face the transparent substrate to obtain a substrate with a prism structure. As to a method of disposing the prism structure such that the prism structure faces the transparent substrate, this method can be attained by applying the prism structure to the transparent substrate by using a UV-curable adhesive.

A light transmittable positive electrode, an organic layer including a luminescent layer and a negative electrode are formed on the substrate with a prism structure, to obtain an organic EL device.

In the case of using the organic EL device of the invention in a system known as a top emission system, a positive electrode, an organic layer and a light-transmittable negative electrode are formed on a separate substrate and then, the aforementioned substrate with a prism structure is either applied to the separate substrate or placed on the separate substrate through a spacer such that the prism structure faces the negative electrode side, whereby an organic EL device can be obtained.

The organic EL device manufactured in this manner has high luminescence, can display a high-contrast image and is free from the problem as to a rainbow color caused by the diffraction of reflected light.

Examples of materials used for the transparent substrate in the organic electroluminescent device of the invention include quarts glass, no-alkali glass, soda lime glass or plastic films. Also, the organic electroluminescent device may be any of a fluorescent device and a phosphorescent device. As to other structural elements such as an electrode and organic layer in the electroluminescent device, those described in each publication of JP-A Nos. 2004-221068, 2004-214178, 2004-146067, 2004-103577, 2003-323987, 2002-305083, 2001-172284 and 2000-186094 (the disclosure of which is incorporated by reference herein) may also be applied in the same manner.

Here, the layer structure of the organic electroluminescent device of the invention will be explained as to a part of the embodiment thereof with reference to the drawings. FIG. 1 is a view of the layer structure of a bottom-emission system, wherein 1 represents a transparent substrate, 2 a prism structure, 3 a first electrode, 4 an organic layer containing a luminescent layer and 5 a second electrode.

Figure 2:
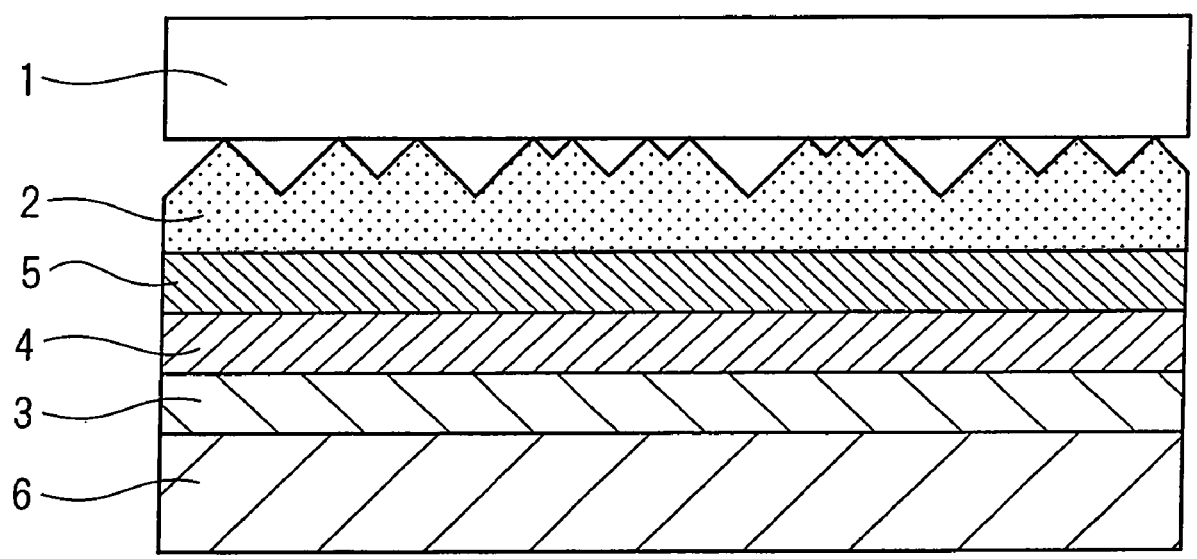
FIG. 2 is a view showing a layer structure of a top emission system that is one embodiment of an organic electroluminescent device according to the invention.
Figure 3:
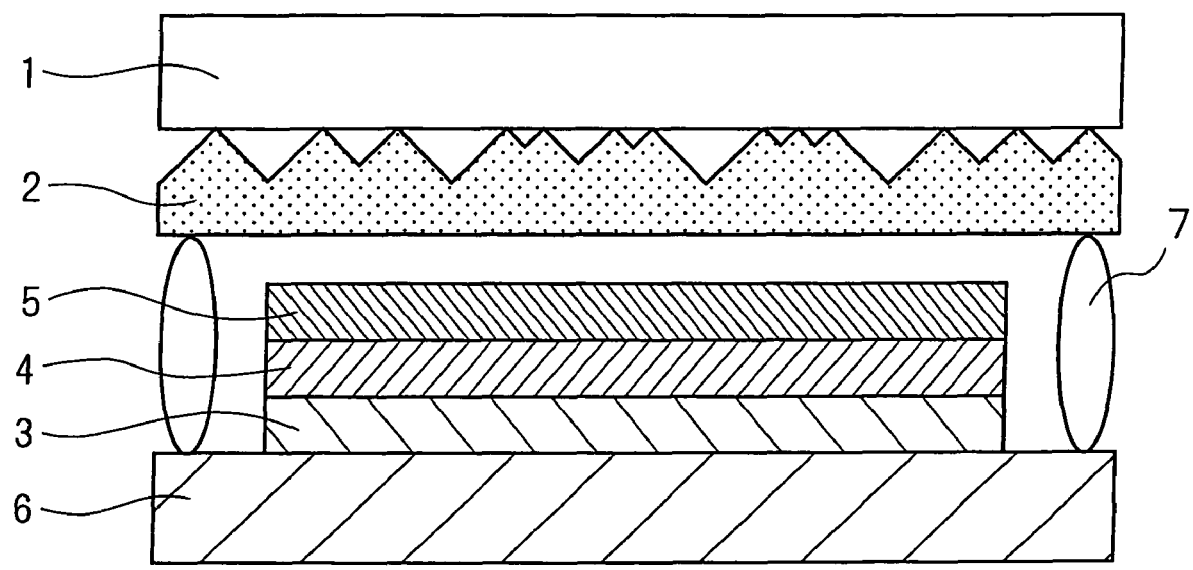
FIG. 3 is another view showing a layer structure of a top emission system that is one embodiment of an organic electroluminescent device according to the invention.

FIGS. 2 and 3 are views of the layer structure of a top-emission system, wherein the symbols are common to those in FIG. 1. In this embodiment, a first electrode, an organic layer and a second electrode are formed on a substrate and this substrate can be combined with a prism structure formed on a transparent substrate to manufacture the top emission system electroluminescent device. 7 represent a spacer It is to be noted that inclusion of layers other than the aforementioned layers is also within the scope of these embodiments.

EXAMPLES

The present invention will be explained by way of examples, which are, however, not intended to limit the scope of the invention.

Example 1

A diamond bite is used to cut the surface of Ni thereby manufacturing 8 molds 1 to 8 having each pitch shown in Table 1.

The molds 1 to 3 are comparative molds having a regular pitch (coefficient of variation<1%) and the molds 4 to 8 are those in which the pitch had the randomized values shown in Table 1 and the levels of the apexes (peaks) accorded to each other.

A silicone elastomer is poured into each mold, cured and then released from the mold to manufacture a prism pattern (8 types) made of silicone.

A UV-curable type epoxy resin is applied to a 30 μm thick glass plate in an amount of 12 ml/m$^2$. This amount is 24 ml/m$^2$ only in the case of the device 3. The foregoing silicone prism pattern is pressed against the resin and UV light is applied from the glass substrate side to cure the resin. Next, when the silicone pattern is removed, a 30 μm thick prism (8 types) is formed on the glass plate.

This prism is applied to a glass substrate 0.7 mm in thickness in such a manner that the surface of the prism faced the glass substrate and a positive electrode (thickness: 0.15 μm) of an indium tin oxide (ITO, indium/tin in the molar ratio of 95:5) is formed using a d.c. power source on the 30 μm thick glass substrate by a sputtering method. The surface resistance of this positive electrode is 10 Ω/cm$^2$.

An organic compound layer is disposed on this positive electrode.

An organic hole transport layer comprising N,N'-dinaphthyl-N,N'-diphenylbenzidine is formed in a thickness of 0.04 μm by a vacuum deposition method.

On the transport layer, an organic luminescent layer comprising tris(8-hydroxyquinolino)aluminum was formed in a thickness of 0.06 μm by a vacuum deposition method.

A patterned mask is disposed above the organic compound layer to deposit magnesium/silver (in the molar ratio of 10:1) having a thickness of 0.25 μm and further silver in a thickness of 0.3 μm in a vapor deposition apparatus, thereby producing a negative electrode. An aluminum lead wire is drawn from each of the positive electrode and the negative electrode to manufacture organic EL devices 1 to 8.

On the other hand, a organic EL device 9 as a comparative example is formed in the same manner as above except that the prism structure is not contained.

A d.c. voltage of 12 V is applied to each device to make the device emit light, to measure the front luminance. The ratio of the luminance of each device to that of the device 9 is shown as the degree of an improvement in luminance.

A repeat pattern of an emission line and a non-emission line is displayed on a display to see the visibility of a line image. An image in which any image blurring is not observed visually is rated as G1 and an image in which some image blurring is observed is rated as G2. The results are shown in Table 1.

Next, a circular polarizing plate is disposed on the device and allowed to emit light, and in this condition, a rainbow color is observed from various angles to evaluate the degree of the rainbow color according to the following 5-point scoring method. The results are shown in Table 1.

Each sample is evaluated by the standard of evaluation:
5 points: no rainbow color is observed visually,
4 points: a rainbow color is hardly observed visually,
3 points: a rainbow color is slightly observed visually,
2 points: a rainbow color can be observed visually, and
1 point: a rainbow color can be clearly observed visually.

A sample evaluated as 3 points or more has practically no problem and a sample is more preferably evaluated as 4 points or more.

alcohol (trade name: PVA102, manufactured by Kuraray Co., Ltd.) solution (the amount of the alcohol: 30% by weight based on the titanium oxide) and sodium dodecylbenzenesulfonate (0.05% by weight based on the coating solution) are mixed and this aqueous solution (20 g/m$^2$ as titanium oxide) is applied to the foregoing fine random prism, followed by drying.

The resulting coated product is subjected to heat treatment carried out at 600° C. for one hour in an electric furnace.

This heat treatment allows the epoxy resin and PVA to disappear to form a structure in which the random prisms of titanium oxide disposed on the glass such that their apexes faced the glass are mounted on the no-alkali glass substrate.

A positive electrode (thickness: 0.15 μm) of an indium tin oxide (ITO, indium/tin in the molar ratio of 95:5) is formed on the side opposite to the prism apexes by using a d.c. power

TABLE 1

| Device No. | Mold No. | Pitch range | Average pitch | Shape of distribution | Coefficient of variation | Degree of improvement in luminance | Contrast | Rainbow color | |
|---|---|---|---|---|---|---|---|---|---|
| 1 | 1 | At a constant interval of 5 μm | 5 μm | — | 0.6%* | ×1.8 | G1 | 1 | Comparative Example |
| 2 | 2 | At a constant interval of 10 μm | 10 μm | — | 0.3%* | ×1.8 | G1 | 1 | Comparative Example |
| 3 | 3 | At a constant interval of 24 μm | 24 μm | — | <0.1%* | ×1.8 | G2 | 4 | Comparative Example |
| 4 | 4 | 2-5 μm | 3.5 μm | Uniform | 25% | ×1.8 | G1 | 4 | The invention |
| 5 | 5 | 7.2-7.7 μm | 7.5 μm | Normal | 1% | ×1.8 | G1 | 3 | The invention |
| 6 | 6 | 7-8 μm | 7.5 μm | Normal | 3% | ×1.8 | G1 | 4 | The invention |
| 7 | 7 | 6-9 μm | 7.5 μm | Normal | 7% | ×1.8 | G1 | 4 | The invention |
| 8 | 8 | 5-10 μm | 7.5 μm | Normal | 14% | ×1.8 | G1 | 5 | The invention |
| 9 | None | — | — | — | — | ×1 | G1 | 5 | Comparative Example |

*Though the pitches were designed at equal intervals, the coefficient of variation in these pitches is as large as that shown in the table because the accuracy of mechanical processing during formation of prisms is unsatisfactory.

As is apparent from Table 1, it is found that devices 1-3 and 9, which have a coefficient of variation of less than 1% and is provided with no prism are respectively inferior in any of the above evaluation items. In contrast, devices 4 to 8 of the invention exhibit good properties in any of the above evaluation items though there are some characteristic dispersions among these devices.

Example 2

A diamond bite is used to cut the surface of Ni, thereby manufacturing a mold 9. The mold 9 has an apex angle of 90° and has the same groove bottom levels. When viewed at each bottom part, the pitches are randomized in a range from 5 to 10 μm, the average pitch is 7.5 μm, and the coefficient of variation is 5%.

A silicone elastomer is poured into the mold, cured and then released from the mold to manufacture a prism pattern made of silicone.

A UV-curable type epoxy resin is applied to a 0.7 mm thick no-alkali glass plate by an amount of 12 ml/m$^2$. The foregoing silicone prism pattern is pressed against the resin and UV light is applied from the glass substrate side to cure the resin. Next, when the silicone pattern is removed, a fine random prism pattern is formed on the glass plate.

The resulting product is irradiated with light of an excimer lamp (172 nm) for 10 minutes to make the surface hydrophilic.

In a titanium oxide sol (trade name: Tainoc A-6, manufactured by Taki Chemical Co., Ltd.), an aqueous polyvinyl source by a sputtering method. The surface resistance of this positive electrode is 10 Ω/cm$^2$.

An organic compound layer is disposed on this positive electrode.

An organic hole transport layer comprising N,N'-dinaphthyl-N,N'-diphenylbenzidine is formed in a thickness of 0.04 μm by a vacuum deposition method. On the transport layer, an organic luminescent layer comprising tris(8-hydroxyquinolino)aluminum was formed in a thickness of 0.06 μm by a vacuum deposition method.

A patterned mask is disposed above the organic compound layer to vapor-deposit magnesium/silver (in the molar ratio of 10:1) having a thickness of 0.25 μm and also silver with a thickness of 0.3 μm in a vapor deposition apparatus, thereby producing a negative electrode. An aluminum lead wire is drawn from each of the positive electrode and the negative electrode to manufacture an organic EL device 10.

A d.c. voltage of 12 V is applied to the EL device 10 to make the device emit light. The luminescence of the device is 2.5 times higher than that of the comparative device 9 measured in Example 1.

A repeat pattern of a emission line and a non-emission line is displayed on a display of the device 10 to see the visibility of a line image, to find that the display exhibits a problem-free contrast.

Next, the device is provided with a circular polarizing plate and allowed to emit light, and in this condition, any rainbow color due to the diffraction of reflected light is not observed even if viewed from various angles.

What is claimed is:

1. An organic electroluminescent device comprising a first electrode, a second electrode, at least one organic layer containing a luminescent layer and disposed between the first electrode and the second electrode, a transparent substrate disposed on a side from which light is extracted and a prism structure disposed between the first electrode or the second electrode and the transparent substrate, wherein the prism structure is disposed such that the apexes of prisms included therein face the transparent substrate side and the coefficient of variation in the pitch of the apexes of the prisms is 1% or more and the average of the pitch of the apexes of the prisms is 15 μm or less.

2. The organic electroluminescent device of claim 1, wherein the coefficient of variation in the pitch of the apexes of the prisms is 3% or more.

3. The organic electroluminescent device of claim 1, wherein the first electrode is a positive electrode and the second electrode is a negative electrode and the prism structure is disposed on the first positive electrode side.

4. The organic electroluminescent device of claim 1, wherein the first electrode is a positive electrode and the second electrode is a negative electrode and the prism structure is disposed on the second negative electrode side.

5. The organic electroluminescent device of claim 1, wherein the average of the pitch of the apexes of the prisms is 10 μm or less.

6. The organic electroluminescent device of claim 1, wherein the apexes of the prisms have the same height and are adhered to the transparent substrate.

7. The organic electroluminescent device of claim 1, wherein the minimum value and maximum value of the pitch of the apexes of the prisms satisfy the following relation:

$$1.05 \times P_{min} \leq P_{max} \leq 5 \times P_{min}.$$

8. The organic electroluminescent device of claim 1, wherein the apex angle of the prisms is 60° to 120°.

9. The organic electroluminescent device of claim 8, wherein the apex angle of the prisms is 80° to 100°.

10. The organic electroluminescent device of claim 1, wherein the structural material of the prism structure is an acryl resin, an epoxy resin, a polyimide resin or a polycarbonate resin.

11. The organic electroluminescent device of claim 1, wherein the structural material of the prism structure is a metal oxide.

12. The organic electroluminescent device of claim 1, wherein the distance from the prism side surface of the luminescent layer to the bottom of the prisms is 100 μm or less.

13. The organic electroluminescent device of claim 1, wherein the distance from the prism side surface of the luminescent layer to the bottom of the prisms is 50 μm or less.

14. The organic electroluminescent device of claim 1, wherein the average of the pitch of the apexes of the prisms is 0.4 μm to 15 μm.

15. The organic electroluminescent device of claim 5, wherein the average of the pitch of the apexes of the prisms is 0.4 μm to 10 μm.

16. The organic electroluminescent device of claim 1, wherein the coefficient of variation in the pitch of the apexes of the prisms is from 3% to 25%.

* * * * *